United States Patent [19]
Woratyla et al.

[11] Patent Number: 5,290,174
[45] Date of Patent: Mar. 1, 1994

[54] ELECTRICAL CONNECTOR FOR A CARD READER

[75] Inventors: John A. Woratyla, Camp Hill; John W. Kaufman, Hershey; John L. Broschard, III, Harrisburg, all of Pa.

[73] Assignee: The Whitaker Corporation, Wilmington, Del.

[21] Appl. No.: 976,038

[22] Filed: Nov. 13, 1992

Related U.S. Application Data

[63] Continuation-in-part of Ser. No. 926,628, Aug. 10, 1992.

[51] Int. Cl.$^5$ ............................................. H01R 9/09
[52] U.S. Cl. ................................. 439/59; 439/377; 439/540
[58] Field of Search .............. 439/59, 64, 78, 79, 439/80, 83, 377, 444, 540, 701, 638, 640

[56] References Cited

U.S. PATENT DOCUMENTS

| | | | |
|---|---|---|---|
| 3,711,814 | 1/1973 | Pomella et al. | 439/377 |
| 3,768,066 | 10/1973 | Mattingly, Jr. et al. | 439/377 |
| 3,775,643 | 11/1973 | Schachnow et al. | 317/101 |
| 3,801,953 | 4/1974 | Lynch | 439/377 |
| 3,932,016 | 1/1976 | Ammenheuser . | |
| 4,046,443 | 9/1977 | Champagne . | |
| 4,861,277 | 8/1989 | Bina | 439/377 |
| 4,941,841 | 7/1990 | Darden et al. | 439/377 |
| 5,030,115 | 7/1991 | Regnier et al. | 439/540 X |
| 5,176,523 | 1/1993 | Lai | 439/377 X |

Primary Examiner—Larry I. Schwartz
Assistant Examiner—Khiem Nguyen

[57] ABSTRACT

An electrical connector (1) comprises; a housing (2), a card receiving mouth (3), electrical contacts (4), prong receiving sockets (26) on the housing (2) card guide arms (5, 6), a prong (25) on each of the guide arms (5, 6) for locking engagement with any one of the sockets (26), and each of the sockets (26) lockingly engage one of the guide arms (5, 6) only with a card receiving groove (22) of one guide arm (5, 6) being oriented to face toward another guide arm (5, 6).

10 Claims, 7 Drawing Sheets

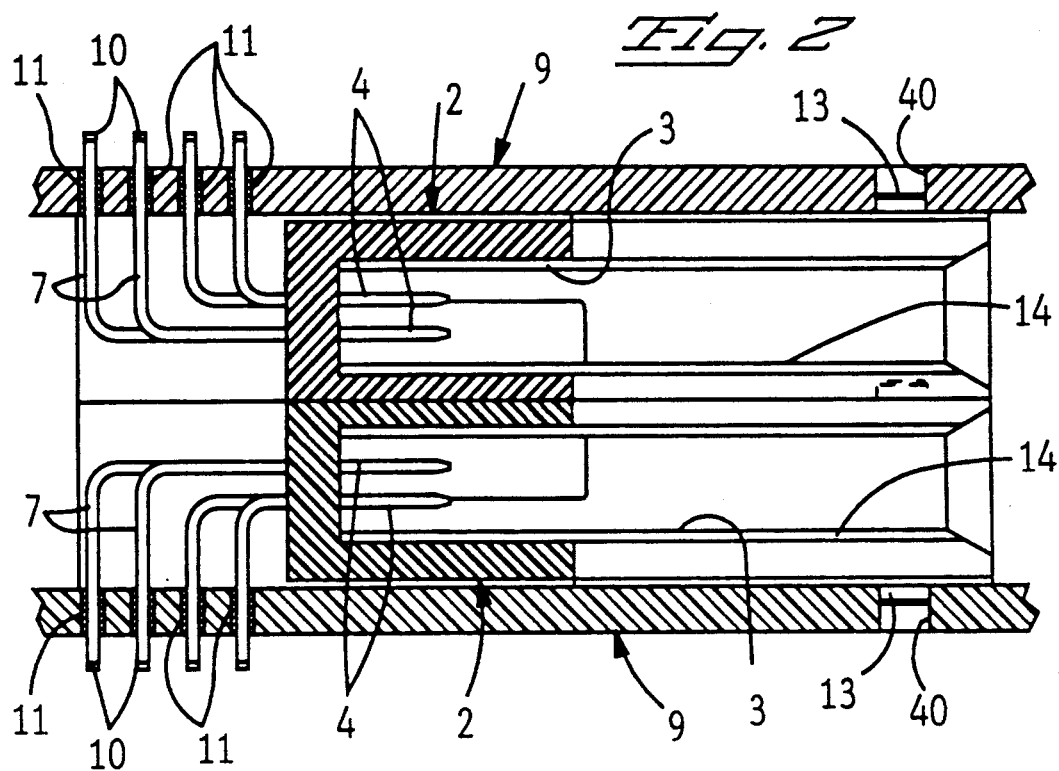
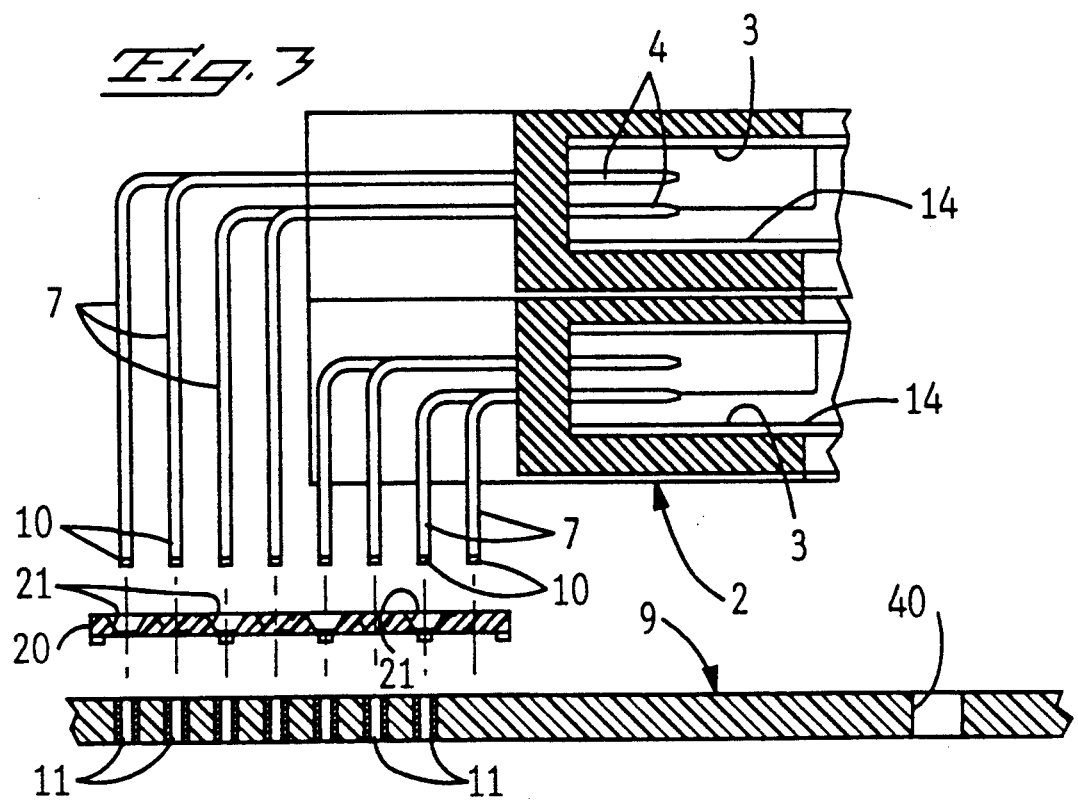

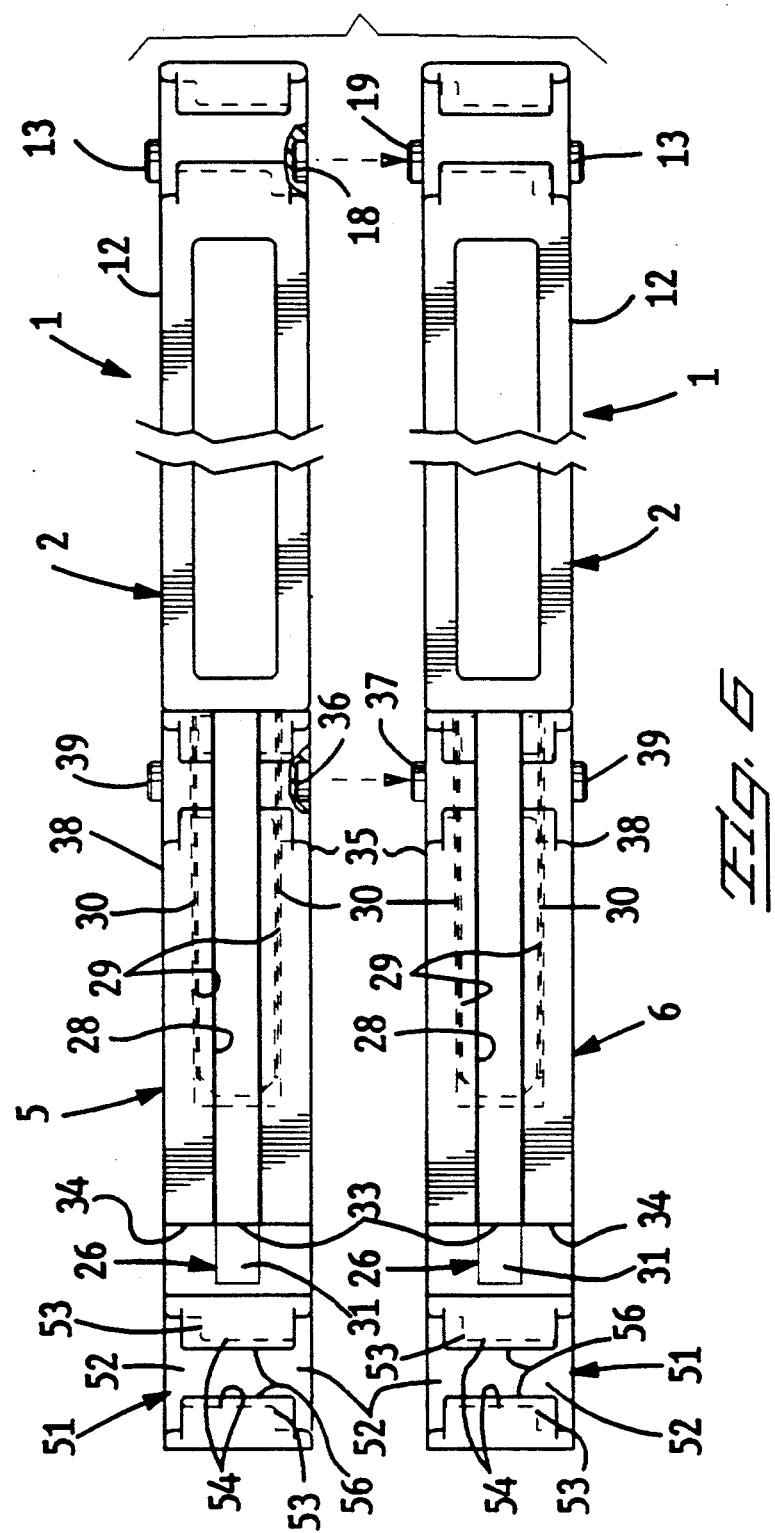

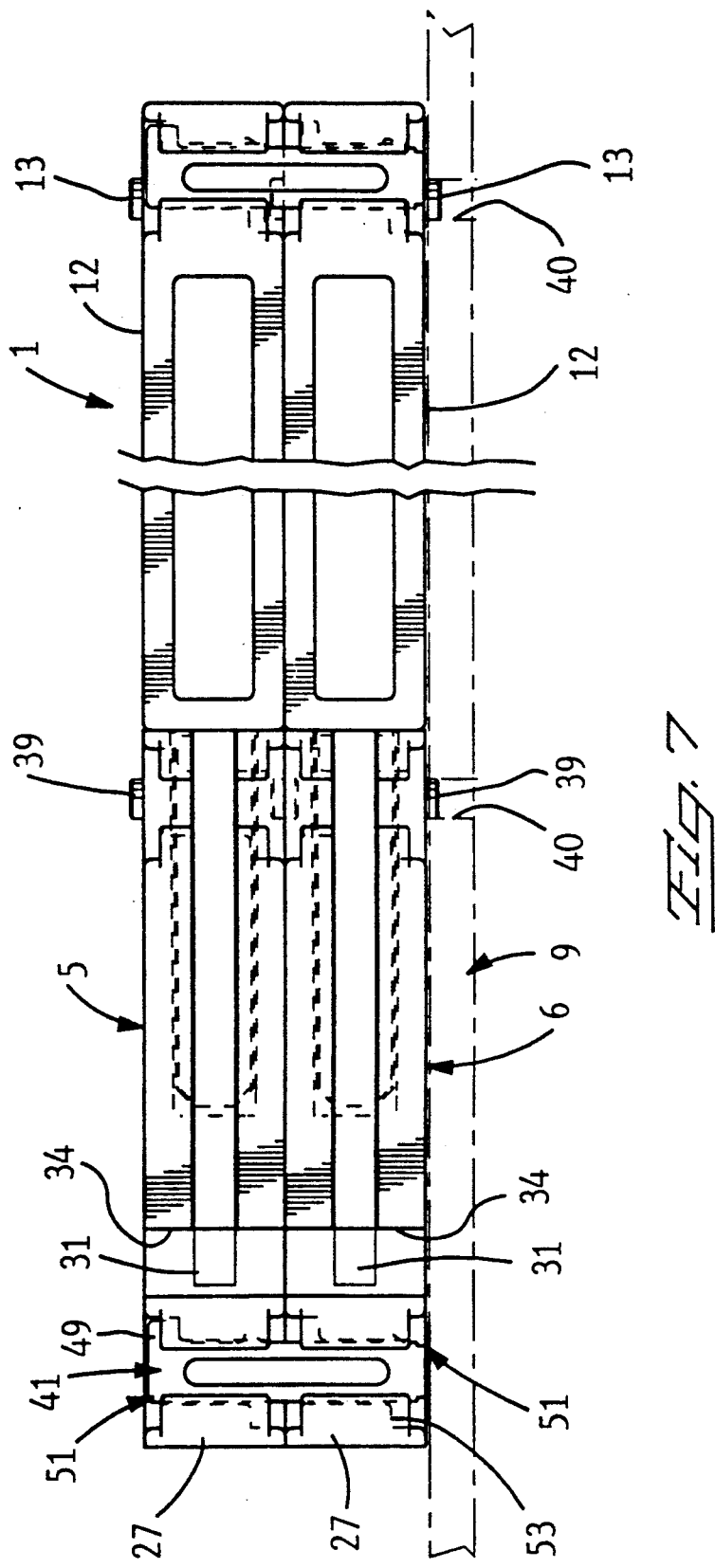

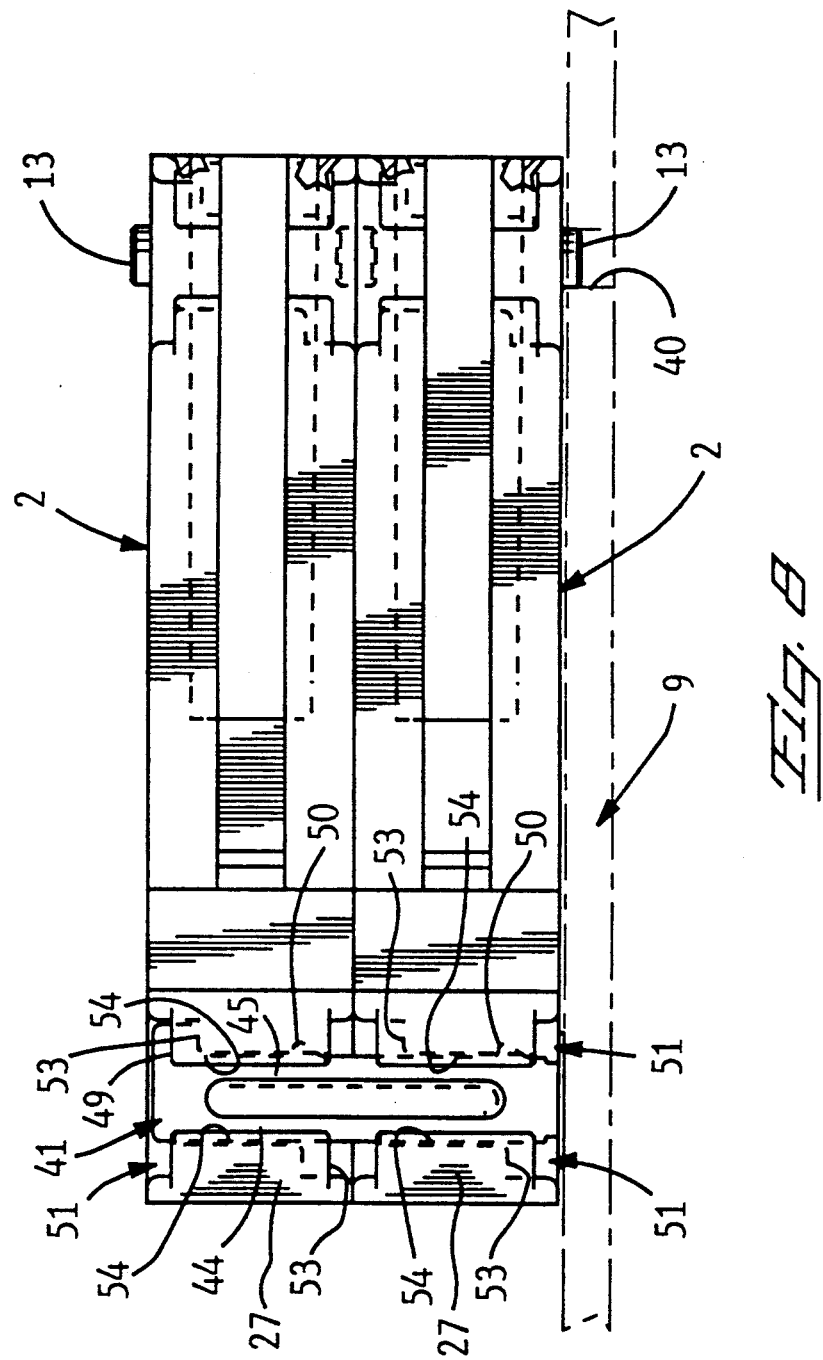

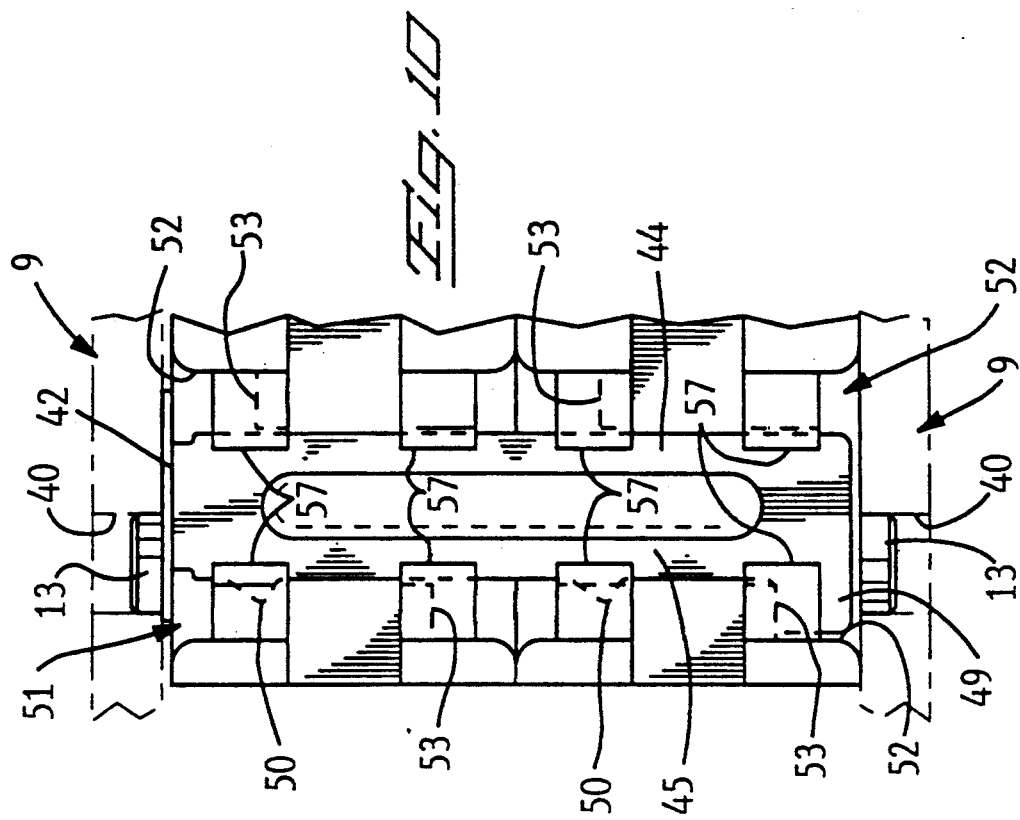
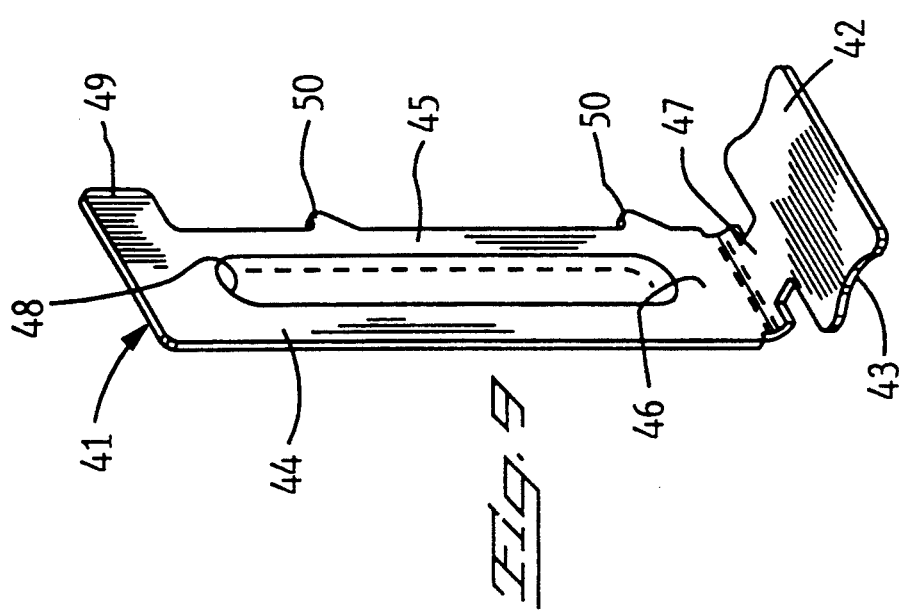

ELECTRICAL CONNECTOR FOR A CARD READER

CROSS REFERENCE TO RELATED APPLICATION

This application is a Continuation In Part of Application Ser. No. 07/926,628 Filed Aug. 10, 1992.

FIELD OF THE INVENTION

The invention relates to an electrical connector for a card reader, and more particularly, to an electrical connector having guide arms for guiding a card into the connector.

BACKGROUND OF THE INVENTION

A known electrical connector, disclosed in U.S. Pat. No. 3,775,643, comprises, a card edge connector having end guides, and card guiding channels mounted on respective end guides. The connector is suitable for mounting against a mother board with the card guiding channels standing outwardly from the motherboard. The guide receiving channels extend beyond the card edge connector and lockingly engage in holes in the motherboard.

SUMMARY OF THE INVENTION

The present invention resides in an electrical connector for a card reader, comprising, a card receiving housing and a set of card guide arms constructed with card receiving grooves for guiding edges of a card to be received in a mouth of the housing. Each of the guide arms is constructed with a prong for locking engagement with any one of multiple sockets on the housing, provided that each of the guide arms locks to the housing only with the card receiving groove facing toward a groove of another guide arm. Thereby, according to an advantage of the invention, the guide arms can be assembled to any of the sockets, and be inverted with respect to the housing or not.

According to another advantage of the invention, the guide arms are inverted for stacked interlocked assembly with other guide arms. The guide arms stack and interlock with one another only when inverted to provide two sets of interlocked card guides for two separate cards.

DESCRIPTION OF THE DRAWINGS

Embodiments of the invention will now be described by way of example with reference to the accompanying drawings in which;

FIG. 2 is a section view of stacked electrical connectors each with electrical contacts, and with one of the connectors inverted, together with the electrical contacts, mounted to first and second circuit boards;

FIG. 3 is a view similar to FIG. 2, with one of the connectors inverted, and with the electrical contacts of the stacked connectors extending to a single side;

FIG. 6 is an enlarged side view of the housings and sets of guide rails shown in FIG. 1 prior to being stacked;

FIG. 7 is a view similar to FIG. 6 of the housings and sets of guide rails stacked and interlocked and mounted to a circuit board by mounting brackets;

FIG. 8 is an fragmentary enlarged view of the housings shown in FIG. 7;

FIG. 9 is an enlarged perspective view of a mounting bracket; and

FIG. 10 is an enlarged fragmentary view of the stacked housings and an inverted mounting bracket mounted to a second circuit board.

DETAILED DESCRIPTION

Figure 1:
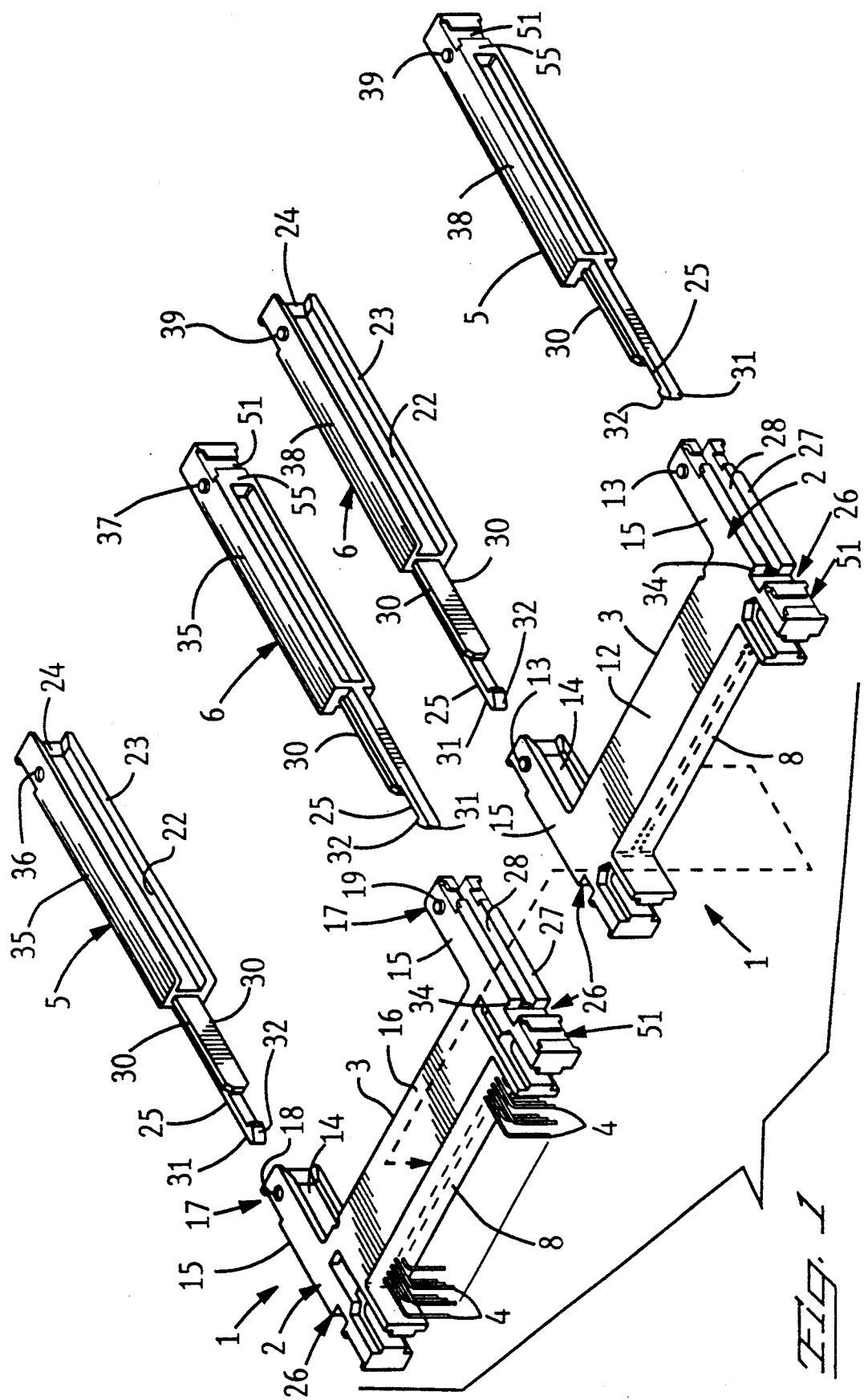
FIG. 1 is a perspective view of an electrical connector and a set of card guide arms, together with an inverted electrical connector accompanied by a set of inverted card guide arms.
Figure 4:
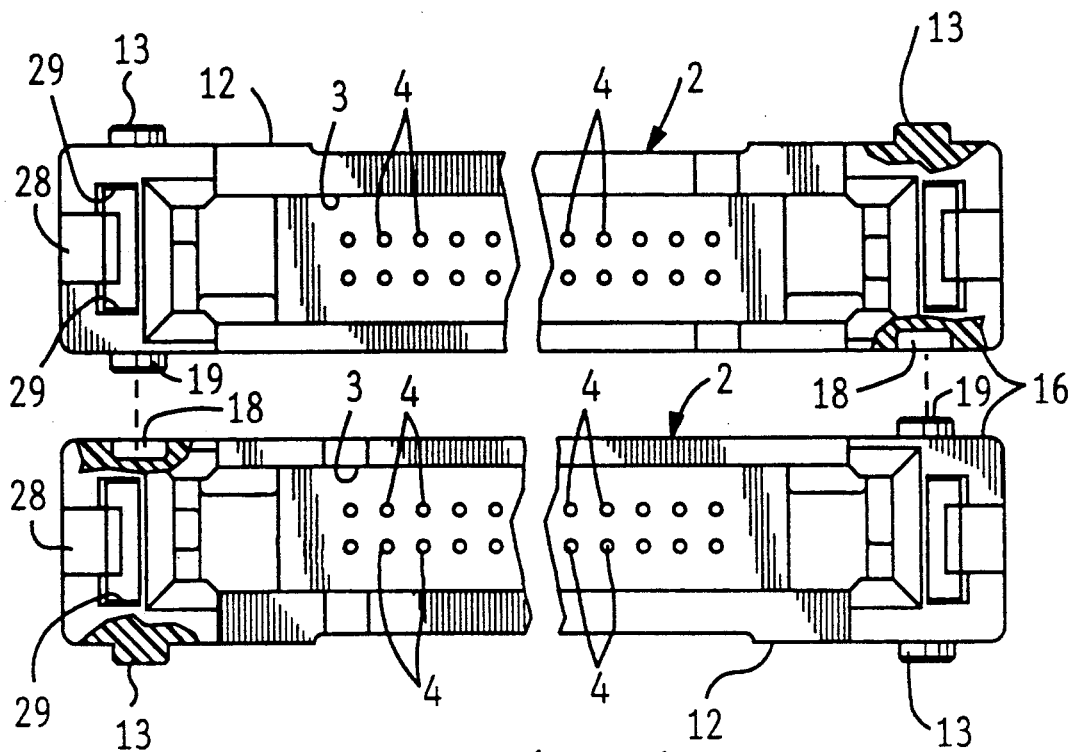
FIG. 4 is an enlarged end view of the connectors shown in FIG. 1 prior to being stacked, and with the contacts removed.
Figure 5:
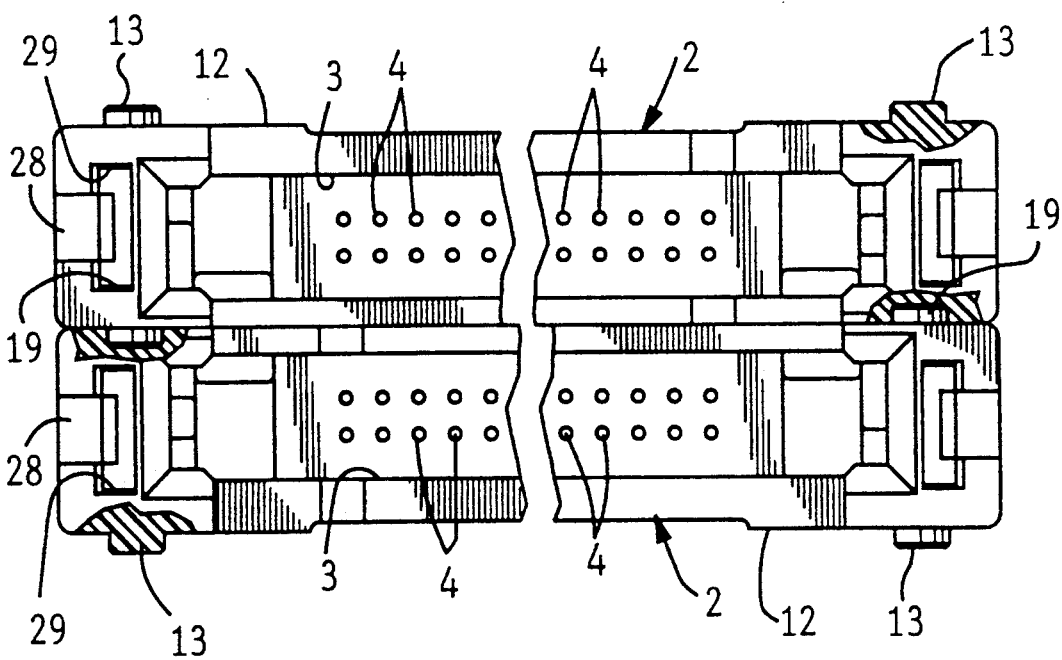
FIG. 5 is a view similar to FIG. 4 of the connectors stacked and interlocked.

With reference to FIG. 1, an electrical connector 1, especially suitable for use in a card reader, not shown, includes an insulating housing 2 having a card receiving mouth 3, FIG. 2, multiple electrical contacts 4 held by the housing 2 extending in two rows and into the mouth 3, and a set of card guide arms 5, 6.

With reference to FIG. 3, tail sections 7 of the contacts 4 extend outwardly of a rear surface 8 of the housing 2 for connection to a first circuit board 9 shown in phantom outline. Feet 10 on free ends of the contacts 4 are adapted with respective shapes for connection to the circuit board 9. For example, the feet 10 are shaped as posts for insertion into plated apertures 11 of the circuit board 9. Alternatively, the feet 10 can be shaped as surface mount flat portions, not shown, for connection to surface mount pads, not shown, on the circuit board 9.

Again with reference to FIG. 1, the connector 1 is accompanied by a duplicate housing 2, inverted, accompanied by another set of guide arms 5, 6, inverted. A bottom surface 12 of each housing 2 has a pair of projecting feet 13. Each housing 2 has started grooves 14 in forwardly projecting housing arms 15 on opposite sides of the mouth 3. A top surface 16 of each housing 2 has a locking structure 17 in the form of a recess 18 on one side flanking the mouth 3, and a projecting knob 19 in another side flanking the mouth 3. The duplicate housings 2 can be stacked and interlocked, FIG. 2, when inverted with respect to each other, with the recess 18 of each housing receiving the knob 19 of the other housing.

Each housing 2 is constructed for use alone on the circuit board 9, or for interlocking with a duplicate housing 2. The card receiving mouth 3 is defined either by a single housing 2 or by two housings 2. The card receiving mouth 3 is adapted to receive one or, alternatively, two cards, one for each of the stacked housings 2. The cards are known in the industry, and are disclosed, for example, in U.S. Pat. No. 5,033,972.

Again with reference to FIG. 2, additional contacts 4 extend in two rows into a card receiving mouth 3 of the inverted housing 2. Tail sections 7 of the additional contacts 4 extend outwardly of the rear surface 8 of the inverted housing 2 for connection to a second, inverted circuit board 9. With reference to FIG. 3, the additional contacts 4 extend outwardly of the rear surface 8 of the inverted housing 2 for connection to the first circuit board 9. A thin web 20 of insulating material having rows of alignment apertures 21 can be assembled onto the spaced apart tail sections 7 of the contacts 4 to maintain their spacing apart from one another. Additional webs 20, not shown, can also be assembled to the tail sections 7 of the contacts 4 shown in FIG. 2.

The guide arms 5, 6 of each set are of unitary construction molded from a thermoplastic material. FIG. 1, card receiving grooves 22 on inside surfaces 23 extend along lengths of the respective guide arms 5, 6. Flared, groove mouths 24 at respective ends of the guide arms 5, 6 open into respective grooves 22 of the guide arms 5, 6. At opposite ends of respective guide arms 5, 6, respective elongated prongs 25 extend outwardly.

The prongs 25 lockingly engage in sockets 26, the sockets 26 being in respective, exterior side surfaces 27 of the housing 2 flanking the mouth 3. The prongs 25 have respective cross sections that interfit slidably along grooves 28 in the respective, exterior side surfaces 27 of the housing 2. With reference to FIGS. 4, 5, 6, and 7, the grooves 28 have undercut sides 29 that overlap widened edges 30 of the prongs 25. Ends of the prongs 25 have respective locking latches 31 with transverse, projecting fingers 32. The fingers 32 are forced to bend resiliently as they traverse in respective grooves 28, until the fingers 32 emerge from ends 33 of the grooves 28 and unbend to register against transverse latch shoulders 34 at the ends 32 of the grooves 28. Thereby, the prongs 25 lockingly engage the sockets 26. The prong 25 on each of the guide arms 5, 6 is constructed for locking engagement with any one of the sockets 26. Each of the sockets 26 lockingly engages one of the guide arms 5, 6 only with the card receiving groove 22 of the one guide arm 5, 6 being oriented to face toward a groove 22 of another guide arm 5, 6 of the same set. Such a construction allows assembly of a set of guide arms 5, 6 to a housing 2, whether or not the set is inverted with respect to the housing 2.

A first guide arm 5 of each set comprises a top surface 35, FIG. 1, having a locking structure in the form of a recess 36. A second guide arm 6 of each set comprises a top surface 35, having a locking structure in the form of a projecting knob 37.

With reference to FIGS. 1 and 6, stacking and interlocking of the two sets of guide arms 5, 6 will be described. The inverted set of guide arms 5, 6 must be inverted with respect to the other set, for the guide arms 5, 6 of one set to stack and interlock with the guide arms 5, 6 of the other set. Each first guide arm 5 engages and interlocks with a second guide arm 6 when a knob 37 of the second guide arm 6 is received in a recess 36 of the first guide arm 5, FIGS. 1 and 6. The guide arms 5, 5 of a like kind are unable to interlock with each other. The guide arms 6, 6 of a like kind are unable to interlock with each other. However, only two kinds of guide arms 5, 6 are needed to construct stacked and interlocked sets of guide arms 5, 6. The sets comprise, multiple pairs of guide arms 5, 6 stacked one inverted pair on the other pair, and first locking structures 36 on respective first guide arms 5 of said pairs interlocking with second locking structures 37 on respective second guide arms 6 of said pairs.

Each of the first guide arms 5, and each of the second guide arms 6 have respective bottom surfaces 38. Feet 39 project from respective bottom surfaces 38. With reference to FIG. 7, the feet 39 of one set of the guide arms 5, 6 project to register in respective alignment apertures 40 of the first circuit board 9. The feet 13 of one of the housings 2 project to register in additional alignment apertures 40 of the first circuit board 9, FIGS. 7 and 2.

The inverted housing 2, FIG. 2, has the inverted feet 13 thereof in registration with additional alignment apertures 40 of the inverted circuit board 9. The inverted set of the guide arms 5, 6 have the feet 39 thereof shown inverted in FIG. 7, permitting the feet 39 thereof to register with alignment apertures 40 in the inverted circuit board 9 shown in FIG. 2.

With reference to FIGS. 8 through 10, a mounting bracket, 41 FIG. 9, of unitary construction, is stamped and formed from a strip of metal, and comprises, a flat base 42 having serpentine shaped edges 43 of serpentine lengths adapted to be wetted by molten solder, not shown, for solder connection of the base 42 to a conductive pad, not shown, of the circuit board 12 or the inverted circuit board 12. A pair of coplanar arms 44, 45 project from the base 42, the base 42 being bent to extend transverse to the thickness plane of the arms 44, 45. The arms 44, 45 are joined by a first bight 46 joined to the base 42 by a thin, strain relieving, web 47 that is bendable when forces are applied to the arms 44, 45 to prevent transfer of the forces to the base 42, and thereby, prevent the forces from dislodging the base 42 from its solder connection. A second bight 48 bridges remote ends of the arms 44, 45. A hold down finger 49 extends laterally of one of the arms 45 in the thickness plane. Also in the thickness plane, a pair of wedge shaped projections 50 are spaced apart along the same arm 45 and extend laterally in the same direction as the hold down finger 49.

The mounting bracket 41 is inserted along one of multiple channels 51 recessed in each of the side surfaces 27 of the housing 2, FIGS. 7, 8 and 10. Each of the channels 51 is widened at opposite, open ends 52 to provide recessed ledges 53 in opposite sides 54 of the channel 51, with one of the ledges 53 being inverted. The hold down finger 49 overlaps the ledge 53 to hold the housing 2 against the circuit board 9, FIGS. 7 and 8. With reference to FIG. 10, the mounting bracket 41 is inverted, such that the hold down finger 49 overlaps the inverted ledge 53 while the base 42 is solder connected to a pad, not shown, on the inverted circuit board 9. The projections 50 of the mounting bracket 41 wedge against a side 54 of the channel, and resiliently deflect the arm 45, such that the arms 44, 45 are biased by the projections 50 to frictionally engage against the opposite sides 54 of the channel 51. A channel 51 of similar construction is recessed in an exterior side 55 of each guide arm 5, 6, FIGS. 1, 6 and 7. Each of the channels 51 in the guide arms 5, 6, and in the housings 2, is constructed with the two open ends 52 and the two ledges 53 to receive a mounting bracket 41 in an inverted position for solder connection of the mounting bracket 41 to the inverted circuit board 9, or, alternatively, to receive a mounting bracket 41 in a non-inverted position for solder connection to the first circuit board 9.

With reference to FIGS. 1, 6, 7, 8 and 10, flanges 56 overhang opposite sides 54 of each channel 51, to overlap edges of the arms 44, 45 of a mounting bracket 41 in the channel 51. One of the flanges 56 on each housing 2 is divided into spaced apart segments 57. Each of the flanges 56 overlies a portion of the hold down finger 49 and the projections 50 to maintain them in the plane of thickness of the mounting bracket 41.

Other embodiments of the invention and modifications of the invention are intended to be covered by the spirit and scope of the claims defining the invention.

We claim:

1. An electrical connector comprising: a housing, a card receiving mouth in the housing, electrical contacts carried by the housing in the mouth, prong receiving sockets on the housing, guide arms on opposite sides of the mouth, a card receiving groove on each of the guide arms, a prong on each of the guide arms being constructed for locking engagement with any one of the sockets, and each of the sockets lockingly engage one of the guide arms only with the card receiving groove of the one guide arm being oriented to face toward another guide arm, allowing assembly of the guide arms to the housing whether or not the guide arms are inverted with respect to the housing, the guide arms comprising multiple pairs of guide arms stacked one pair on another pair, and first locking structures on respective first guide arms of said pairs interlocking with second locking structures on respective second guide arms of said pairs.

2. An electrical connector as recited in claim 1, wherein the first locking structure and the second locking structure of respective first and second guide arms interlock when the respective first and second guide arms are inverted with respect to one another.

3. An electrical connector as recited in claim 1, wherein, the guide arms comprise, multiple pairs of guide arms stacked one pair on another pair, each pair being comprised of a first guide arm and a second guide arm, a first locking structure on each first guide arm interlocking with a second locking structure on a second guide arm, and a projecting foot on each of the first and second guide arms, first locking structures on respective first guide arms of said pairs interlocking with second locking structures on respective second guide arms of said pairs, when the respective first and second guide arms are inverted with respect to one another.

4. An electrical connector as recited in claim 3, wherein, the first locking structure is a recess in each of the first guide arms, the second locking structure is a projecting knob on each of said second guide arms, and a projecting foot on each of said first guide arms and on each of said second guide arms.

5. An electrical connector as recited in claim 1, comprising: each of the guide arms having a locking structure of a first kind being stacked one on the other with another of the guide arms having a locking structure of a second kind, and the guide arms of a like kind being unable to interlock with each other.

6. An electrical connector comprising: a housing, a card receiving mouth in the housing flanked by starter grooves in forwardly projecting housing arms on opposite sides of the mouth, electrical contacts carried by the housing in the mouth, prong receiving sockets on the housing flanking the starter grooves, guide arms on opposite sides of the mouth, a card receiving groove on each of the guide arms, a prong on each of the guide arms being constructed for locking engagement with any one of the sockets, and each of the sockets lockingly engage one of the guide arms only with the card receiving groove of the one guide arm being oriented to face toward a groove of another guide arm, allowing assembly of the guide arms to the housing whether or not the guide arms are inverted with respect to the housing, the guide arms comprising multiple pairs of guide arms stacked one pair on another pair, and first locking structures on respective first guide arms of said pairs interlocking with second locking structures on respective second guide arms of said pairs.

7. An electrical connector as recited in claim 6, wherein the first locking structure and the second locking structure of respective first and second guide arms interlock when the respective first and second guide arms are inverted with respect to one another.

8. An electrical connector as recited in claim 6, wherein, the guide arms comprise, multiple pairs of guide arms stacked one pair on another pair, each pair being comprised of a first guide arm and a second guide arm, a first locking structure on each first guide arm interlocking with a second locking structure on a second guide arm, and a projecting foot on each of the first and second guide arms, first locking structures on respective first guide arms of said pairs interlocking with second locking structures on respective second guide arms of said pairs, when the respective first and second guide arms are inverted with respect to one another.

9. An electrical connector as recited in claim 8, wherein, the first locking structure is a recess in each of the first guide arms, the second locking structure is a projecting knob on each of said second guide arms, and a projecting foot on each of said first guide arms and on each of said second guide arms.

10. An electrical connector as recited in claim 6, comprising: each of the guide arms having a locking structure of a first kind being stacked one on the other with another of the guide arms having a locking structure of a second kind, and the guide arms of a like kind being unable to interlock with each other.

* * * * *